(12) United States Patent
Bradley (10) Patent No.: US 9,210,598 B1
(45) Date of Patent: Dec. 8, 2015

(54) SYSTEMS AND METHODS FOR MEASURING PASSIVE INTERMODULATION (PIM) AND RETURN LOSS

(71) Applicant: ANRITSU COMPANY, Morgan Hill, CA (US)

(72) Inventor: Donald Anthony Bradley, Morgan Hill, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 328 days.

(21) Appl. No.: 13/828,379

(22) Filed: Mar. 14, 2013

(51) Int. Cl.
| | |
|---|---|
| *H04B 17/00* | (2015.01) |
| *G01R 19/00* | (2006.01) |
| *G01R 31/08* | (2006.01) |
| *G01R 27/28* | (2006.01) |
| *H04W 24/04* | (2009.01) |
| *G01R 31/11* | (2006.01) |
| *G01R 27/32* | (2006.01) |
| *H04W 24/00* | (2009.01) |
| *G01R 1/20* | (2006.01) |
| *H02H 1/00* | (2006.01) |

(52) U.S. Cl.
CPC ........... *H04W 24/04* (2013.01); *G01R 19/0007* (2013.01); *G01R 1/203* (2013.01); *G01R 19/0092* (2013.01); *G01R 27/28* (2013.01); *G01R 27/32* (2013.01); *G01R 31/11* (2013.01); *H02H 1/0015* (2013.01); *H04W 24/00* (2013.01)

(58) Field of Classification Search
CPC ... H04W 24/00; H04B 17/15; G01R 19/0092; G01R 1/203; G01R 31/11; G01R 27/32; G01R 27/28; H02H 1/0015

USPC ................... 324/76.11, 520, 612; 455/67.11
See application file for complete search history.

(56) References Cited

U.S. PATENT DOCUMENTS

| | | | |
|---|---|---|---|
| 4,274,047 | A | 6/1981 | Hecken |
| 4,991,098 | A | 2/1991 | Dantzler |
| 5,479,090 | A | 12/1995 | Schultz |

(Continued)

FOREIGN PATENT DOCUMENTS

| | | |
|---|---|---|
| WO | 03030416 | 4/2003 |
| WO | 2012009757 | 1/2012 |

OTHER PUBLICATIONS

Eron, Murat, "PIM Requirements for Low Power Wireless Components and Subsystems", http://fxr.com/resource-library/white-papers/pim-requirements-for-low-power-wireless-components-and-subsystems.*

(Continued)

*Primary Examiner* — Patrick Assouad
*Assistant Examiner* — Hoang X Nguyen
(74) *Attorney, Agent, or Firm* — Tucker Ellis LLP (57) ABSTRACT

An embodiment of a low power system for measuring passive intermodulation (PIM) includes a port, a test signal source, a dielectric frequency domain multiplexer and a receiver. The test signal source provides a test signal including two tones each capable of producing a signal at the test port of amplitude +30 decibels referenced to one milliwatt (dBm) or less. The dielectric frequency domain multiplexer connected with the port and the test signal source and is adapted to multiplex the test signal provided by the test signal source and a measurement signal obtained at the port. The receiver receives the multiplexed measurement signal from the dielectric frequency domain multiplexer and provides a signal indicative of PIM.

24 Claims, 7 Drawing Sheets

(56) References Cited

U.S. PATENT DOCUMENTS

| | | | |
|---|---|---|---|
| 5,513,094 A | 4/1996 | Stanley | |
| 5,602,709 A | 2/1997 | Al-Dabbagh | |
| 5,706,010 A | 1/1998 | Franke | |
| 5,729,145 A | 3/1998 | Blades | |
| 5,973,568 A | 10/1999 | Shapiro | |
| 5,994,905 A | 11/1999 | Franchville | |
| 6,144,692 A | 11/2000 | Beck | |
| 7,068,096 B2 | 6/2006 | Chu | |
| 7,103,114 B1 | 9/2006 | Lapierre | |
| 7,469,190 B2 | 12/2008 | Bickel | |
| 7,511,472 B1 | 3/2009 | Xia | |
| 7,598,714 B2 | 10/2009 | Stanley | |
| 7,629,764 B2 | 12/2009 | Shoemaker | |
| 7,696,850 B2 | 4/2010 | Stanford | |
| 8,058,880 B2 | 11/2011 | Bradley | |
| 8,294,469 B2 | 10/2012 | Bradley | |
| 8,498,582 B1* | 7/2013 | Bradley | 455/67.13 |
| 8,666,322 B1* | 3/2014 | Bradley et al. | 455/67.11 |
| 8,816,672 B1* | 8/2014 | Bradley | 324/76.19 |
| 8,903,324 B1* | 12/2014 | Bradley | 455/67.11 |
| 2002/0030871 A1 | 3/2002 | Anderson | |
| 2002/0094785 A1 | 7/2002 | Deats | |
| 2003/0232600 A1 | 12/2003 | Montgomery | |
| 2005/0141602 A1 | 6/2005 | Hyun | |
| 2009/0096466 A1 | 4/2009 | Delforce | |
| 2009/0124122 A1 | 5/2009 | Stanford | |
| 2009/0125253 A1 | 5/2009 | Blair | |
| 2010/0029553 A1 | 2/2010 | Scheibel | |
| 2010/0052652 A1 | 3/2010 | Mitchell | |
| 2010/0085061 A1* | 4/2010 | Bradley et al. | 324/520 |
| 2010/0164504 A1* | 7/2010 | Bradley | 324/520 |
| 2010/0194382 A1* | 8/2010 | Montena | 324/126 |
| 2010/0295533 A1* | 11/2010 | Kuga et al. | 324/76.39 |
| 2012/0086612 A1 | 4/2012 | Linehan | |
| 2013/0071112 A1* | 3/2013 | Melester et al. | 398/38 |
| 2013/0182753 A1* | 7/2013 | Delforce et al. | 375/228 |
| 2014/0146866 A1* | 5/2014 | Strachan et al. | 375/226 |

OTHER PUBLICATIONS

Hartman et al., "PIM Test Power Levels for Mobile Communications Systems", 2012, Kaelus, http://www.precision-marketing.com/wp-content/uploads/PIM-Test-Methods-IEC-Recommendations-2012.pdf.*

Bell, et al., Range to Fault Technology, Kaelus, 2011, pp. 1-10. Retrieved on Aug. 4, 2014 from: http://www.precision-marketing.com/wp-content/uploads/RTF-white-paper.pdf.

Lui, Passive Intermodulation Interference in Communication Systems, Jun. 1990, pp. 109-118, vol. 2, Issue 3, Electronics & Communication Engineering Journal.

* cited by examiner

SYSTEMS AND METHODS FOR MEASURING PASSIVE INTERMODULATION (PIM) AND RETURN LOSS

TECHNICAL FIELD

The present invention relates to systems and methods for measuring magnitude of passive intermodulation (PIM) and distance to a source of PIM.

BACKGROUND

Passive intermodulation (PIM), commonly referred to as "rusty bolt effect", is the generation of unwanted signals by the non-linear mixing of two or more frequencies in a passive device, such as a connector or cable, that normally behaves linearly but when subject to high radio frequency (RF) power tones behaves nonlinearly. Non-linear behavior can result from a loose or corroded connector or from the close proximity of the device to oxidized metal, for example. PIM is created when two signals from different systems or the same system combine and are then reflected at a PIM source, and can be reduced or eliminated by replacing the PIM source. For example, PIM is commonly resolved by replacing faulty cables or connectors.

PIM has surfaced as a problem for cellular telephone technologies such as Global System for Mobile Communications (GSM), Advanced Wireless Service (AWS) and Personal Communication Service (PCS) systems. Cable assemblies connecting a base station to an antenna on a tower typically have multiple connectors that can act as sources of PIM that interfere with cellular system operation. If the generated PIM harmonic frequency components fall within the receive band of a base station, they can effectively block a channel and make the base station receiver think that a carrier signal is present when one is not. Generally the harmonics of concern are third, fifth, and seventh order, where the third order is of greatest signal strength, and therefore, of primary concern.

Test systems are available to measure PIM, for example, by creating signals at two different frequencies, amplifying them, and providing them through cables connecting a base station to antennas on a tower for the base station. A return signal carrying the PIM is filtered to select a desired test frequency harmonic where PIM can be detected and PIM magnitude and a measurement of the distance to the PIM source is provided to a technician, enabling the technician to locate and replace the PIM source. Such a system is described, for example, in U.S. Pat. No. 8,294,469 entitled "PASSIVE INTERMODULATION (PIM) DISTANCE TO FAULT ANALYZER WITH SELECTABLE HARMONIC" issued to Bradley and incorporated herein by reference.

PIM has also surfaced as a problem for lower power systems such as Distributed Antenna Systems (DAS) which comprise networks of spatially separated antenna nodes connected to a common source via a transport medium that provides wireless service within a geographic area or structure. DAS is often deployed to an environment with many potential sources of PIM through re-radiation of wireless signals. PIM is measured in DAS with test systems used to measure PIM in cellular systems, but at lower powers to more closely match the operating powers of the DAS.

SUMMARY

Embodiments of the present invention are related to systems and methods for use therewith for measuring passive intermodulation (PIM). In accordance with an embodiment, a compact, low power system for measuring PIM includes a port, a test signal source, a dielectric frequency domain multiplexer connected with the port and the test signal source, and a receiver to receive the multiplexed measurement signal from the dielectric frequency domain multiplexer. The test signal source provides a test signal including two tones each capable of producing a signal at the test port of amplitude +30 decibels referenced to one milliwatt (dBm) or less. The test signal source is moreover prevented from producing a signal having an output power above the operating limit of the dielectric frequency domain multiplexer. The dielectric frequency domain multiplexer is adapted to multiplex the test signal provided by the test signal source and a measurement signal obtained at the port. The receiver has an output that provides a signal indicative of PIM. In an embodiment, the dielectric frequency domain multiplexer is either a ceramic diplexer or a ceramic triplexer.

In an embodiment, the PIM is measured in a device under test (DUT), the port is connectable to the DUT, and the measurement signal is obtained from the DUT at the port. In an embodiment, the system includes a vector network analyzer. In such an embodiment, the test signal and the measurement signal are couplable to the vector network analyzer to measure scattering parameters of the DUT. In an embodiment, an antenna is connectable with the port to transmit the test signal and receive the measurement signal to thereby provide an over-the-air PIM measurement of an environment.

In an embodiment, the system includes a reference channel including a PIM reference generator connected with the receiver and providing to the receiver a reference signal having a reference frequency. The reference signal is derivable from the test signal. In an embodiment, the system further includes a return loss channel connectable with the receiver to measure return loss. In an embodiment, the system includes a reference signal filter for filtering the reference signal and the receiver is a synchronous receiver connected with a measurement channel and the reference channel. In such an embodiment, the reference signal filter is a dielectric filter and the phase-detector of the synchronous receiver is a synchronous detector.

In an embodiment, the system includes a transmit signal filter for filtering the test signal before the test signal is multiplexed by the dielectric frequency domain multiplexer, a first receive signal filter for filtering the measurement signal after the measurement signal is multiplexed by the dielectric frequency domain multiplexer, and a second receive signal filter for filtering the measurement signal after the measurement signal is filtered by the first receive signal filter and amplified. The transmit signal filter, the first receive signal filter and the second receive signal filter are dielectric filters.

In an embodiment, a compact, low power system for measuring PIM includes a control unit having a test signal source and a receiver, and a plurality of frequency sub-assemblies each selectively connectable to the control unit and adapted to generate a test signal in a different frequency band. The test signal source providing a test signal including two tones each capable of producing a signal at the test port of amplitude +30 decibels referenced to one milliwatt (dBm) or less and is prevented from producing a signal with output power above the operating limit of the dielectric frequency domain multiplexer. The receiver receives a measurement signal obtained in response to a test signal and has an output that provides a signal indicative of PIM. Each of the frequency sub-assemblies includes a port and a dielectric frequency domain multiplexer connected with the port and the test signal source. The dielectric frequency domain multiplexer is adapted to multiplex the test signal provided by the test signal source and the measurement signal obtained at the port.

In an embodiment, the frequency sub-assemblies are plugins physically separable from the control unit, while in an alternative embodiment the frequency sub-assemblies are components physically housed with the control unit and selectively connectable via switching. In an embodiment, each of the sub-assemblies further includes a reference channel including a PIM reference generator connected with the receiver and providing to the receiver a reference signal having a reference frequency. The reference signal is derivable from the test signal. In an embodiment, each of the sub-assemblies further includes a return loss channel connectable with the receiver to measure return loss.

In an embodiment, a plugin for use with a compact, low power system having a test signal source providing a test signal including two tones each capable of producing a signal at the test port of amplitude +30 decibels referenced to one milliwatt (dBm) or less and a receiver to receive a measurement signal and output a signal indicative of PIM includes a port and a dielectric frequency domain multiplexer connected with the port and the test signal source. The dielectric frequency domain multiplexer is adapted to multiplex the test signal provided by the test signal source and the measurement signal obtained at the port. The plugin is useable with the low power system when the test signal source is prevented from producing a signal above the operating limit of the dielectric frequency domain multiplexer. IN an embodiment, the plugin includes a return loss channel connectable with the receiver to measure return loss.

In an embodiment, the plugin includes a reference channel connected with the receiver to provide the receiver a reference signal having a reference frequency and a PIM reference generator. The plugin provides the measurement signal to the low power system through a measurement channel of the low power system. The reference signal is derivable from the test signal In an embodiment, a method for measuring PIM includes using a low power system, generating a test signal including two tones each having an amplitude of +30 decibels referenced to one milliwatt (dBm) or less, transmitting the test signal, receiving a measurement signal in response to the test signal and obtaining from the measurement signal, via the receiver, a signal indicative of PIM. The low power system includes a port, a test signal source providing a test signal including two tones each capable of producing a signal at the test port of amplitude +30 decibels referenced to one milliwatt (dBm) or less, a dielectric frequency domain multiplexer connected with the port and the test signal source to multiplex a measurement signal obtained at the port and the test signal provided by the test signal source, and a receiver to receive the multiplexed signal from the dielectric frequency domain multiplexer. The test signal source is prevented from producing a signal having an output power above the operating limit of the dielectric frequency domain multiplexer. The method includes multiplexing the test signal through the dielectric frequency domain multiplexer and multiplexing the measurement signal through the dielectric frequency domain multiplexer and to a receiver via a measurement channel.

In an embodiment, the method includes deriving a reference signal from the test signal, providing the reference signal to the receiver via the reference channel, and obtaining from the measurement signal and the reference signal, via the receiver, a signal indicative of a magnitude of the PIM and a distance to a source of the PIM. In an embodiment, the method radiating the test signal to an environment via an antenna or propagating the test signal to a device under test (DUT) via a cable.

In an embodiment, a method for measuring PIM includes using a low power system including a control unit having a test signal source and a receiver, connecting a plugin to the control unit, generating a test signal including two tones each having an amplitude of +30 dBm or less, transmitting the test signal, receiving a measurement signal in response to the test signal, and obtaining from the measurement signal a signal indicative of PIM. In an embodiment, the plugin includes a port and a ceramic diplexer to multiplex a measurement signal obtained at the port and the test signal provided by the test signal source. In an embodiment, the method includes providing, via a reference channel, a reference signal to the receiver derived from the test signal.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number identifies the drawing in which the reference number first appears.

It would be apparent to one of skill in the art that the present invention, as described below, may be implemented in many different embodiments of hardware, software, firmware, and/or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein.

Available systems for measuring passive intermodulation (PIM), also referred to herein as PIM analyzers, typically operate at relatively high output powers when measuring PIM at cellular sites. For example, a PIM analyzer may generate two 20 Watt power tones when measuring PIM at a cellular site. Technicians can use standard PIM analyzers operating at these power levels to measure PIM at other, low power sites, such as distributed antenna system (DAS) sites. However, PIM analyzers are capable of generating tones at much lower powers closer to the operating powers of the low power sites. For example, PIM analyzers may have a lower range on the order of +25 dBm (0.3 Watts) or lower. Technicians can use PIM analyzers operating at these low powers to measure PIM at DAS sites and other low power sites.

Figure 1:
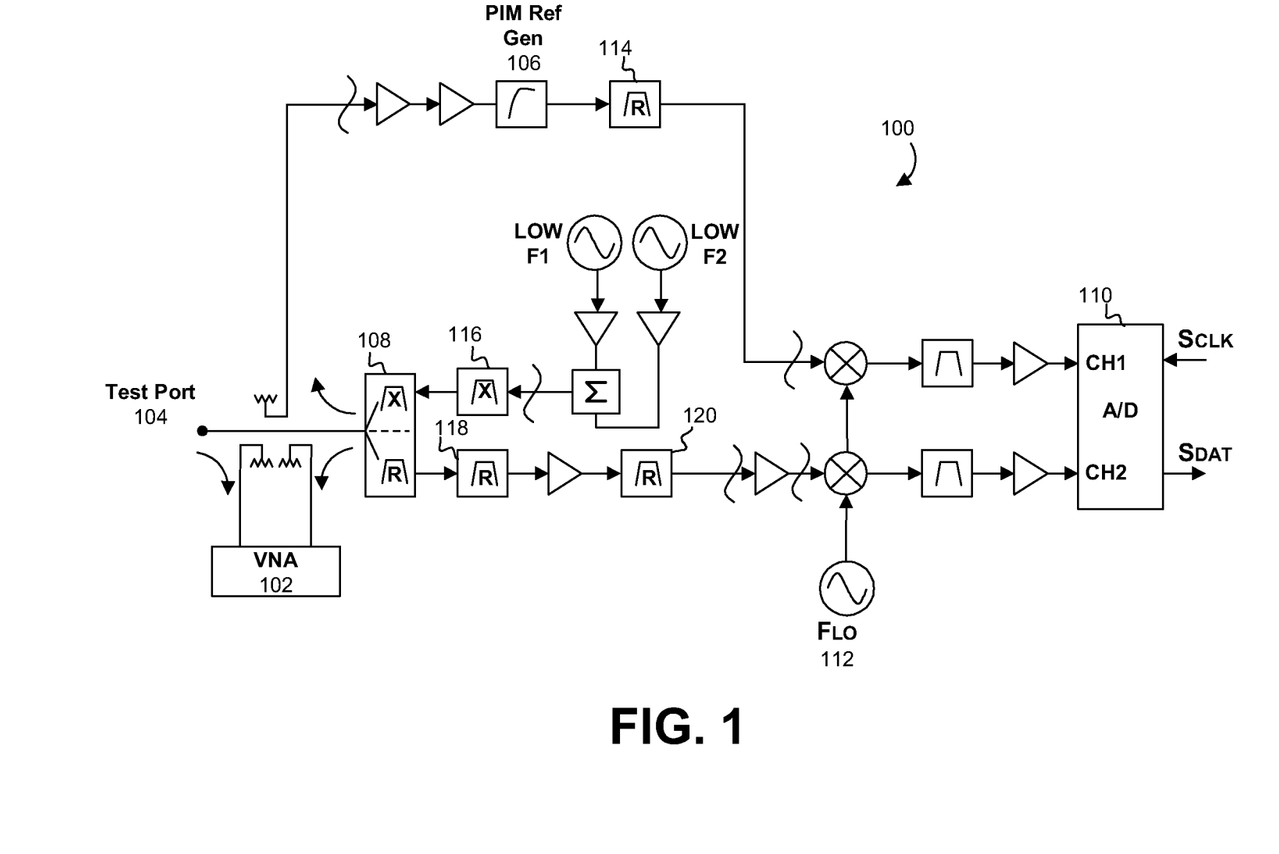
FIG. 1 is a block diagram of an embodiment of a low power system for measuring passive intermodulation (PIM) and/or scattering parameters in accordance with the present invention.

Embodiments of systems and methods in accordance with the present invention allow for measurement of PIM at low power sites, such as DAS sites, with a reduced noise floor. Referring to FIG. 1 an embodiment of a low power system 100 for measuring PIM in a device under test (DUT) or an environment is shown. The DUT (not shown) can include an electrical network, a device, and/or a series of devices, for example that comprise a portion of an electrical network. The system 100 comprises two signal sources LOW F1, LOW F2 for generating two low power signals combined to generate a test signal. For example, in an embodiment, the two signal sources LOW F1, LOW F2 are limited to generating tones of +30 dBm (1 Watt) each. Such powers are on the order of the operating powers of some low power transmission systems, including DAS. The inventor has observed that a noise floor generated by signal sources limited to operating at powers comparable to the low operating powers of targeted, low power systems can be advantageously reduced. For example, a test signal comprising two tones each having a frequency between 720 MHz and 2.7 GHz and amplitude of +30 dBm can result in a measurement signal having a noise floor of −130 dBm. A reduced noise floor can allow the system to more easily and accurately identify the magnitude of PIM and the distance to the PIM.

The system 100 optionally comprises a vector network analyzer (VNA) 102 for measuring scattering parameters (also referred to as S-parameters). The transmitted test signal and the received measurement signal generated by a DUT can be coupled to the VNA for processing. The DUT is connected with the system 100 by way of a test port 104. The DUT can be directly connected to the test port 104, for example, by way of a cable and connector. However, a DUT need not be connected with the test port 104. Embodiments of systems and methods in accordance with the present invention can benefit further from the low power of the test signals generated to safely broadcast test signals over the air. An antenna can be connected with the test port 104 and can transmit test signals via radiation of the test signal and receive measurement signals via re-radiation of the test signal from a PIM source. The type of problem you might find with the "over the air" check can include objects in an environment, for example sprinkler heads or welds in an air duct, that generate a PIM signal separate from a radio system itself but that would still interfere with its proper operation. In a practical implementation a rubber ducky antenna can be mounted at the test port 104 by a technician, allowing the technician to walk around the DAS site and identify PIM sources. Distance to PIM measurements can be utilized to see PIM sources internal to walls or ceilings. Over-the-air measurements are not currently performed using PIM analyzers as it is not convenient to connect up an antenna to the high power PIM analyzers, and as there is a reluctance to radiate the high powers that those units put out.

The system 100 further comprises a diplexer 108 that multiplexes a test signal generated by the signal sources F1, F2 and a measurement signal received via the test port 104. Prior to entering the diplexer and after the tones are combined, the test signal is filtered 116. The measurement signal is also filtered 118, amplified, and filtered 120 again before being downconverted by mixing with a local oscillator (LO) 112 to an intermediate frequency (IF) in a measurement channel CH2 connected with a two channel synchronous receiver 110. The other channel of the synchronous receiver 110 is a reference channel CH1 that provides a reference PIM 106 generated using any known technique for producing a signal that is generally stable in amplitude and phase after calibration. The generated signal is band-pass filtered 114 to remove any undesired response. The synchronous receiver 110 is connected both to the measurement channel CH2 and the reference channel CH1 for simultaneous measurement and conversion of the two received signals.

The synchronous receiver provides serial data (SDAT) indicative of total PIM using the signal received from the measurement channel, the signal received from the reference channel, and a serial clock signal (SCLK). Signal processing can be performed at base band using a synchronous phase coherent detector of the receiver. The system noise and detection bandwidth can be efficiently reduced with averaging.

As shown in FIG. 1, the system has a single stage down converter and two test signal sources. However, one of ordinary skill in the art will appreciate that the system can include additional stages of down converters and additional signal sources. Further, the system can include components for measuring residual PIM resulting from the components of the system itself and removing the residual PIM from PIM measurements, for example as described in U.S. Ser. No. 13/095, 684, which is now U.S. Pat. No. 8,816,672, entitled "SYSTEMS AND METHODS FOR ACCOUNTING FOR RESIDUAL PASSIVE INTERMODULATION IN PASSIVE INTERMODULATION MEASURING INSTRUMENTS" issued to Bradley and incorporated herein by reference. One of ordinary skill in the art will appreciate, upon reflecting on the teachings herein, additional components applicable to embodiments of systems in accordance with the present invention.

The inventor has further observed that by limiting power generated by the system, dielectric diplexers, such as ceramic diplexers, are usable in place of, for example, bulky and expensive triplexer filters that are needed for the intended high power operation of available PIM analyzers. Embodiments of systems in accordance with the present invention comprise a ceramic diplexer 108 and ceramic filters 114, 116, 118, 120. Ceramic filters are unusable and not before conceived for use in network analyzers and PIM analyzers in part due to there inability to function at powers higher than approximately 1 Watt. Ceramic filters are often used, for example, in two-way radio receivers (i.e. walkie-talkies) to enable simultaneous transmitting and receiving (unlike two-way radio receivers that use a half-duplex channel). While reductions in cost are desirable, reductions in size and weight can improve usability for verifying PIM performance at difficult to access sites, which can include some DAS sites.

Figure 2:
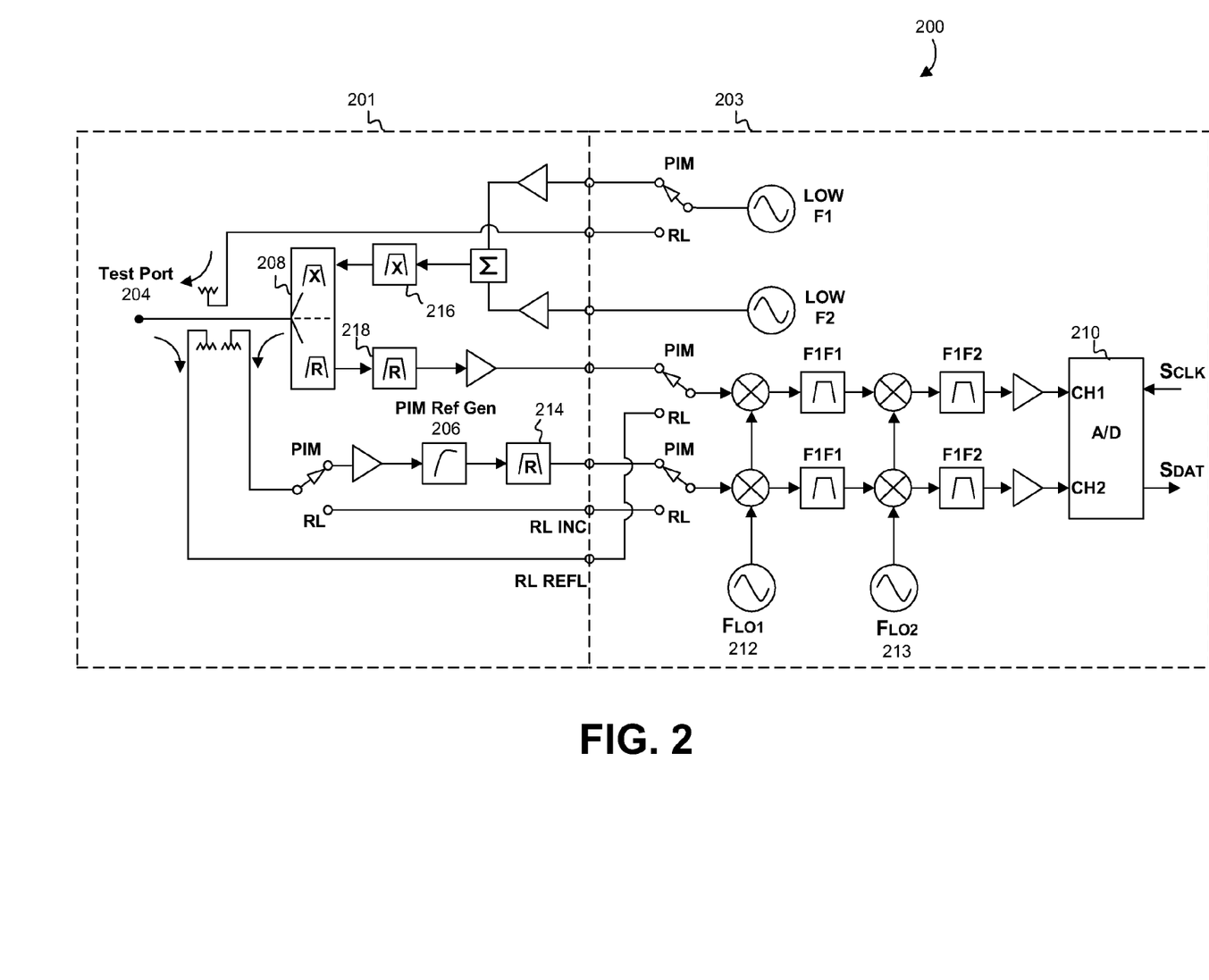
FIG. 2 is a block diagram of an embodiment of a low power system for selectively measuring PIM and/or return loss (RL) in accordance with the present invention.

FIG. 2 illustrates another embodiment of a low power system 200 for measuring PIM and/or return loss (RL). As with the previous embodiment, the system 200 comprises two signal sources LOW F1, LOW F2 for generating two low power signals combined to generate a test signal. For example, in an embodiment, the two signal sources LOW F1, LOW F2 are limited to generating tones of +30 dBm (1 Watt) each. However, unlike the previous embodiment, the embodiment of FIG. 2 comprises a plugin 201 section that operates over a limited band of frequencies and which is mateable with a control unit 203 that comprises the receiver 210 and signal sources LOW F1, LOW F2. The frequency determining circuitry is included in the plugin 201, while the control unit 203 includes wide band circuitry. The diplexer 208 and filters of the plugin 214, 216, 218 use miniature ceramic filters. The small size of the ceramic filters enables the plugin 201 to be relatively small when compared with similar components of standard PIM analyzers, allowing multiple plugins operating over separate and/or overlapping frequency bands to be conveniently taken to a DAS site and selectively mated with the control unit as required.

As with the previous embodiment, the system includes a reference channel CH1 and a measurement channel CH2, the circuit paths of which are completed when the plugin 201 is mated with the control unit. As shown, the channels include a two stage down converter and two local oscillators 212, 213 for downconverting the measurement signal and reference PIM to intermediate frequencies (IF). The synchronous receiver 110 is connected both to the measurement channel CH2 and the reference channel CH1 for simultaneous measurement and conversion of the two received signals.

The embodiment of FIG. 2 is selectably switchable to measure return loss (RL) or alternatively to measure PIM and distance-to-PIM. When the system is switched to measure return loss, the system uses one of the sources (F1 as shown) to excite the test port with RF. The two other couplers are used for standard forward (incident (INC)) and reverse (reflected (REFL)) measurements needed for measuring return loss. The synchronous receiver provides serial data (SDAT) indicative of total PIM using the signal received from the measurement channel, the signal received from the reference channel, and a serial clock signal (SCLK) when the system is switched to measure PIM. The synchronous receiver provides serial data (SDAT) indicative of return loss (RL) using the forward and reverse measurements when the system is switched to measure RL. Signal processing can be performed at base band using a synchronous phase coherent detector of the receiver. The system noise and detection bandwidth can be efficiently reduced with averaging.

As above, the DUT is connected with the system 200 by way of a test port 204 of the plugin 210. The DUT can be directly connected to the test port 204, for example, by way of a cable and connector. However, the DUT need not be physically connected with the test port 204. For example, an antenna can be connected with the test port 204 and can transmit test signals via radiation of the test signal and receive measurement signals via re-radiation of the test signal from a PIM source. For example, in a practical implementation a rubber ducky antenna can be mounted at the test port 204 by a technician, allowing the technician to walk around the DAS site and identify PIM sources.

Figure 3:
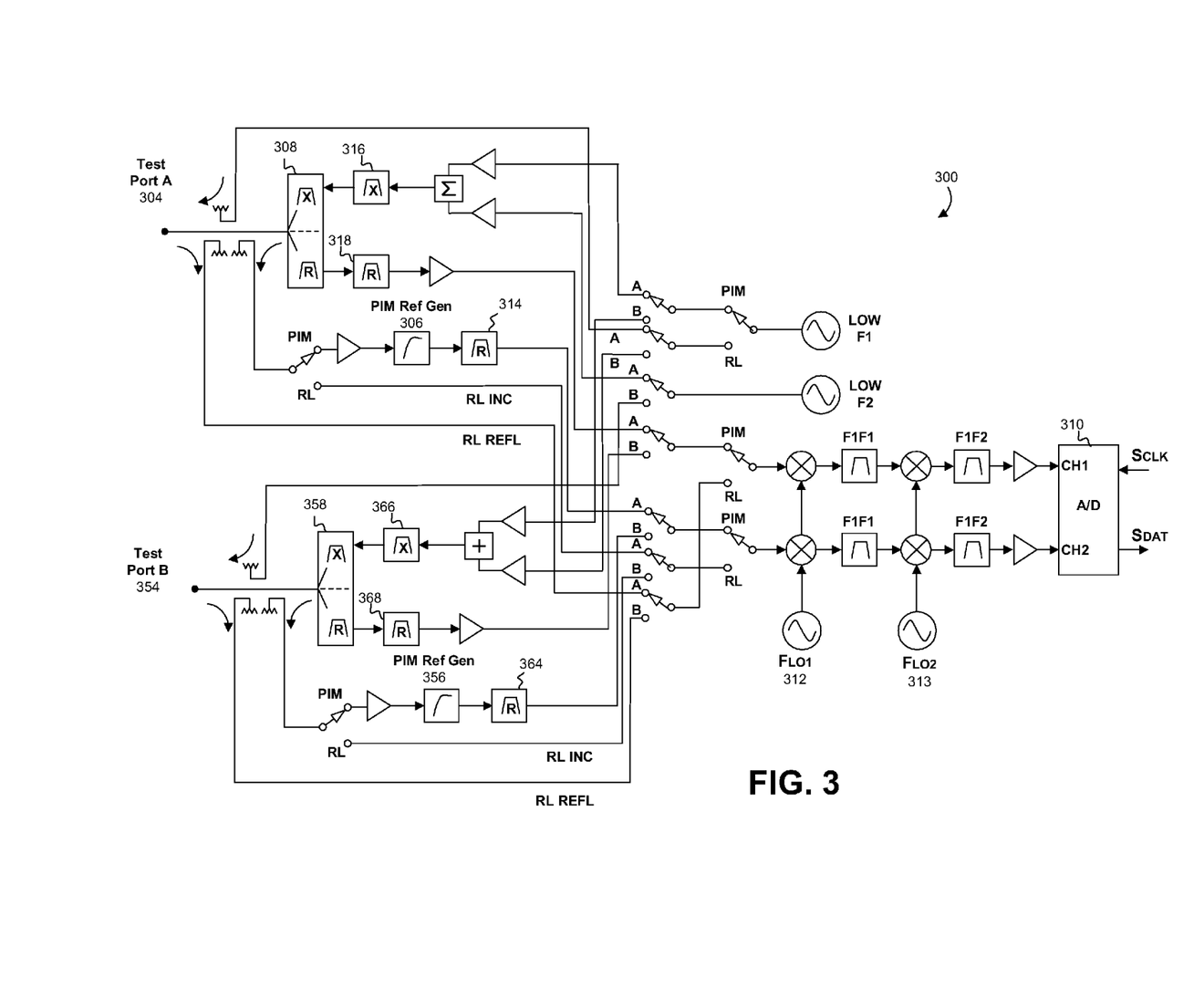
FIG. 3 is a block diagram of another embodiment of a low power system for selectively measuring PIM and/or RL in accordance with the present invention.
Figure 4:
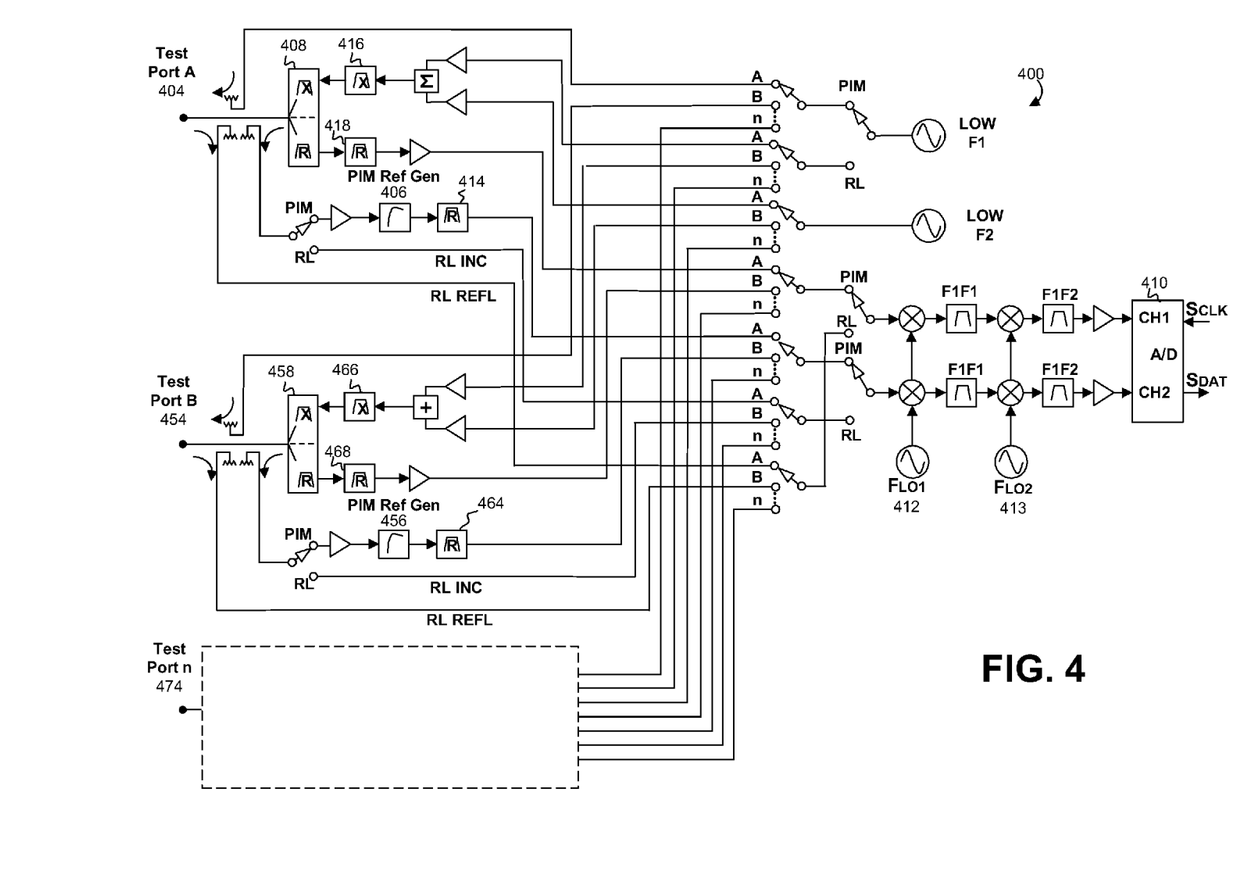
FIG. 4 is a block diagram of another embodiment of a low power system for selectively measuring PIM and/or RL in accordance with the present invention.

FIG. 3 illustrates a further embodiment of a low power system 300 for measuring PIM and/or return loss (RL). As with the previous embodiment, the system 300 comprises two signal sources LOW F1, LOW F2 for generating two low power signals combined to generate a test signal. For example, in an embodiment, the two signal sources LOW F1, LOW F2 are limited to generating tones of +30 dBm (1 Watt) each. However, unlike the previous embodiments, the embodiment of FIG. 3 comprises multiple test ports connecting the DUT to circuitry operating over different frequency bands. The frequency determining circuitry is switched in by the selection of the technician. As shown, and for reasons of size, the embodiment includes two ports A and B, but in other embodiments can have as many ports (n) as is practical given the size of the resulting system. One such system is shown in FIG. 4 having Test Ports A through n 404, 454, 474, wherein the nth set of components is not shown due to space limitations, but which could resemble those of Test Ports A and B 404, 454. The diplexer 308, 358 and filters 214, 216, 218, 364, 366, 368 all use miniature ceramic filters. The inclusion of multiple ports on the system 300 is enabled by the use of ceramic filters, which are small enough to enable the use of many more filters in the same size housing as a system using a standard triplexer. The inclusion of multiple test ports operating over separate and/or overlapping frequency bands reduces the amount of equipment that a technician needs to keep track of and provides convenient access to signals generated in different frequency bands.

As with the previous embodiments, the system includes a reference channel CH1 and a measurement channel CH2. As shown, the channels include a two stage down converter and two local oscillators 312, 313 for downconverting the measurement signal and reference PIM to intermediate frequencies (IF). The synchronous receiver 310 is connected both to the measurement channel CH2 and the reference channel CH1 for simultaneous measurement and conversion of the two received signals.

The system 300 is selectably switchable to measure return loss (RL) or alternatively to measure PIM and distance-to-PIM. As with the previous embodiment, when the system is switched to measure return loss, the system uses one of the sources (F1 as shown) to excite the test port with RF. The two other couplers are used for standard forward (incident (INC)) and reverse (reflected (REFL)) measurements needed for measuring return loss. The synchronous receiver provides serial data (SDAT) indicative of total PIM using the signal received from the measurement channel, the signal received from the reference channel, and a serial clock signal (SCLK) when the system is switched to measure PIM. The synchronous receiver provides serial data (SDAT) indicative of return loss (RL) using the forward and reverse measurements when the system is switched to measure RL. Signal processing can be performed at base band using a synchronous phase coherent detector of the receiver. The system noise and detection bandwidth can be efficiently reduced with averaging.

As above, the DUT is connected with the system 300 by way of a test port 304 of the plugin 310. The DUT can be directly connected to the test port 304, for example, by way of a cable and connector. However, the DUT need not be physically connected with the test port 304. For example, an antenna can be connected with the test port 304 and can transmit test signals via radiation of the test signal and receive measurement signals via re-radiation of the test signal from a PIM source. For example, in a practical implementation a rubber ducky antenna can be mounted at the test port 304 by a technician, allowing the technician to walk around the DAS site and identify PIM sources.

Figure 5:
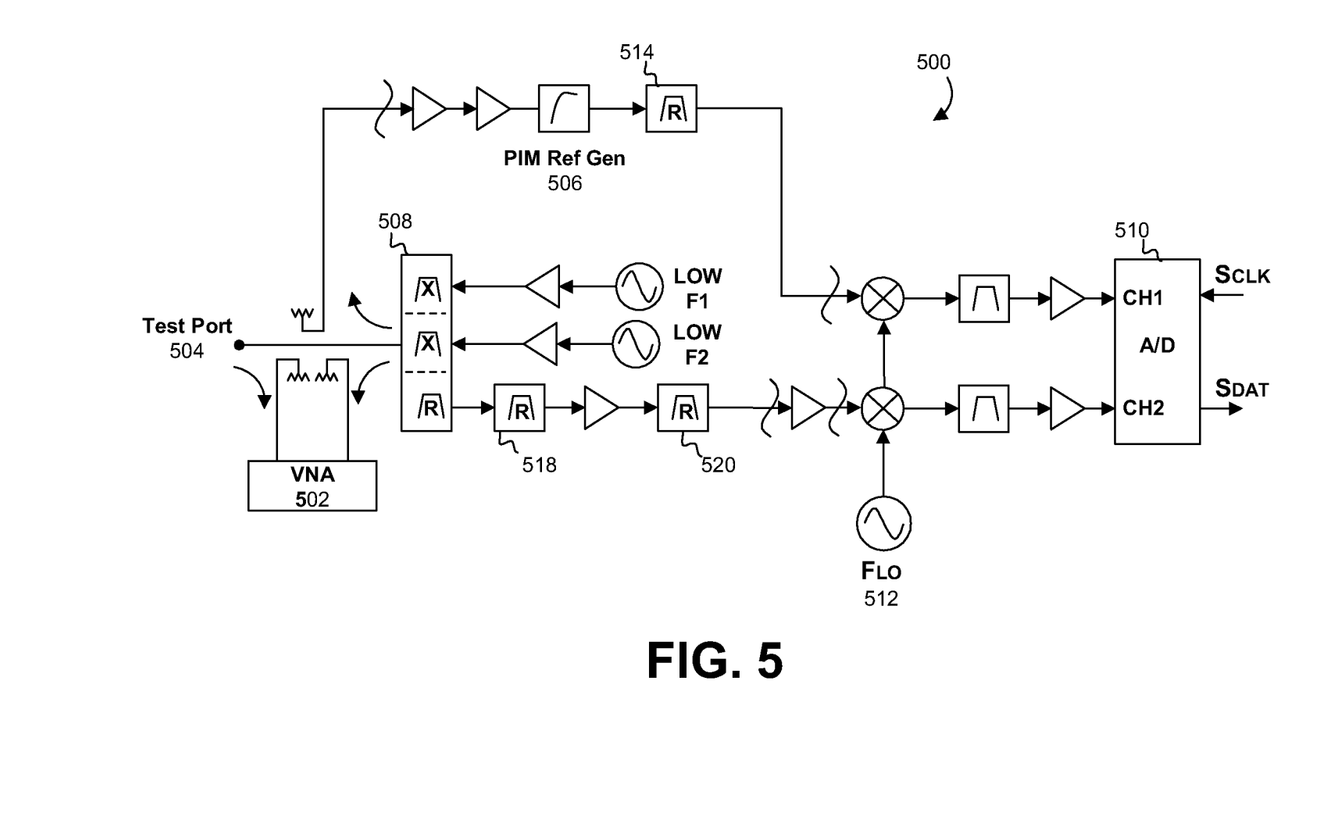
FIG. 5 is a block diagram of another embodiment of a low power system for selectively measuring PIM and/or scattering parameters in accordance with the present invention.

FIG. 5 illustrates another embodiment of a low power system 500 for measuring PIM and/or scattering parameters. The system resembles the system of FIG. 1, and operates as described above, with the exception that the system 500 uses a dielectric triplexer 508, such as a ceramic triplexer, in substitution for the ceramic diplexer. A triplexer is used to separate the transmit tones from the received signal. The two transmit tones are isolated from each other by the two transmit filters. The triplexer can be considered tri-band filters with direct no loss summing. Diplexers and triplexers are passive devices that implements frequency domain multiplexing, and are also collectively referred to herein as "frequency domain multiplexers." The amplified signals from the two signal sources LOW F1, LOW F2 are multiplexed into the triplexer 408 along with the measurement signal received at the test port. A similar arrangement can be substituted, for example, for the diplexer 208, 308, 358, 408, 458 of the embodiments of FIGS. 2-4.

Figure 6:
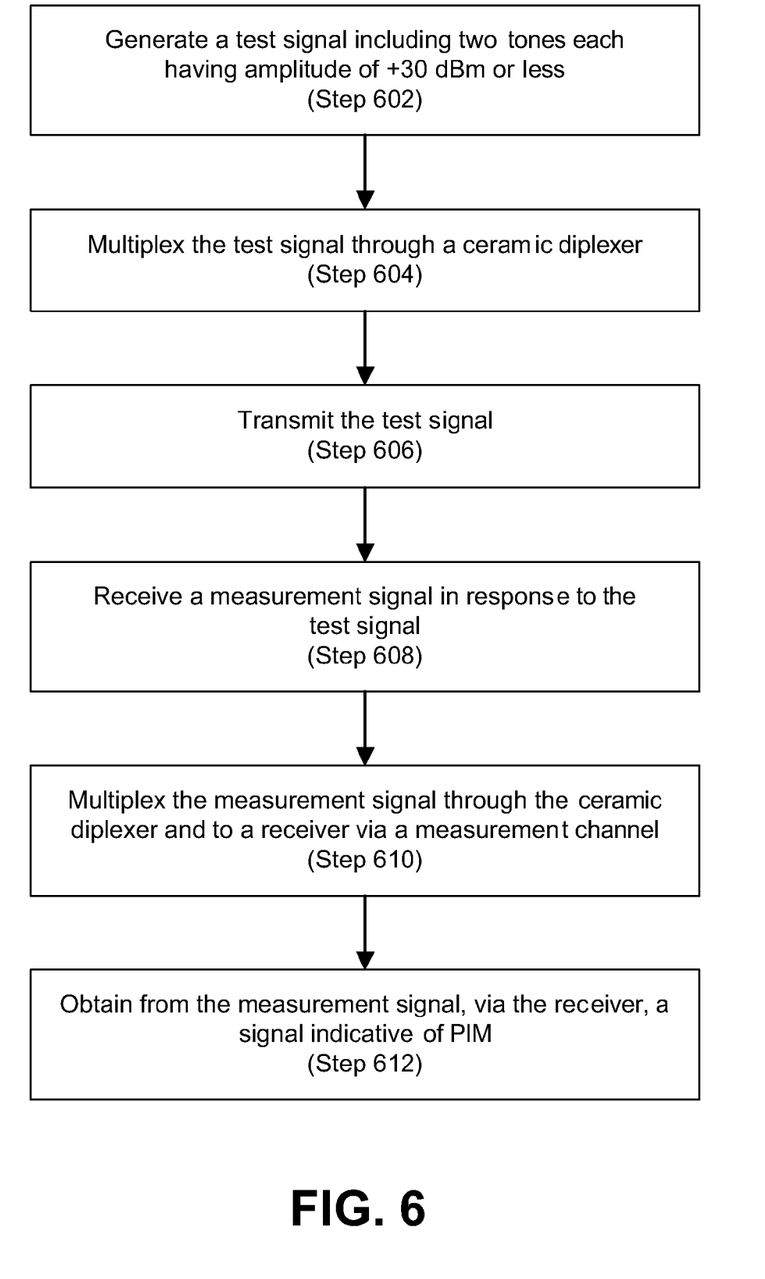
FIG. 6 is a flowchart of an embodiment of a method for measuring passive intermodulation (PIM) in accordance with the present invention.

FIG. 6 is a flowchart of an embodiment of a method for measuring PIM in accordance with the present invention. The method comprises generating a test signal including two tones each having amplitude of +30 dBm or less (Step 602). The test signal is multiplexed through a dielectric frequency domain multiplexer, such as a ceramic diplexer, (Step 604) and transmitted, either to the DUT or over-the-air (Step 606). A measurement signal is received in response to the test signal (Step 608) and multiplexed through the ceramic diplexer and to a receiver via a measurement channel (Step 610). The receiver outputs a signal indicative of PIM from the measurement signal (Step 612). The signal indicative of PIM comprises a magnitude of the PIM and a distance to a source of the PIM. The method further comprises deriving a reference signal from the test signal for use by the receiver in outputting the signal indicative of PIM. The test signal can be transmitted by radiating the test signal via an antenna or by propagating the test signal via a cable. In other embodiments, tones having amplitude above +30 dBm can be used; however, the amplitude should not exceed the operating limited of the ceramic diplexer.

Figure 7:
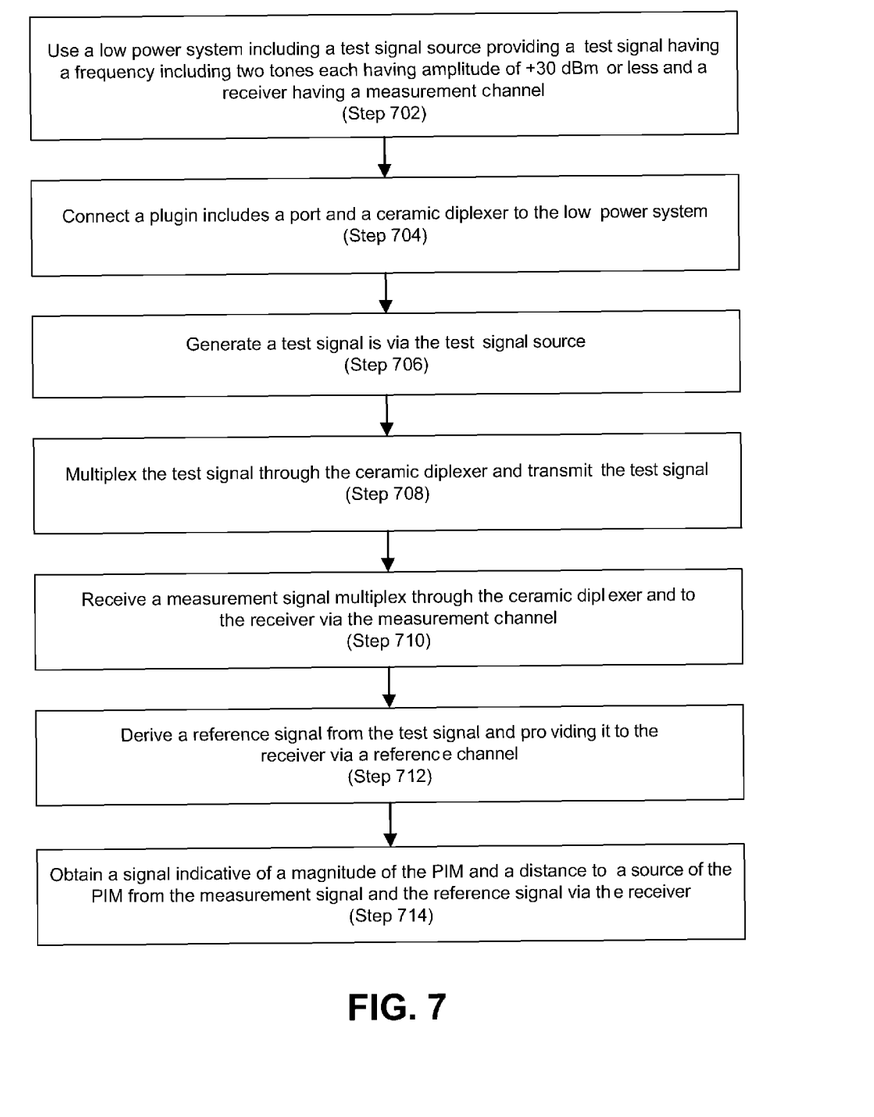
FIG. 7 is a flowchart of an alternative embodiment of a method for measuring PIM in accordance with the present invention.

FIG. 7 is a flowchart of an alternative embodiment of a method for measuring PIM in accordance with the present invention. The method comprises using a low power system including a receiver having a measurement channel (Step 702). The low power system further includes a test signal source providing a test signal including two tones each having amplitude of +30 dBm or less. A plugin is connected to the low power system (Step 704). The plugin includes a port and a dielectric frequency domain multiplexer, such as a ceramic diplexer, connected with the port and the test signal source to multiplex a measurement signal obtained at the port and the test signal provided by the test signal source. A test signal is generated via the test signal source (Step 706). The test signal is multiplexed through the ceramic diplexer and transmitted, either to the DUT or over-the-air (Step 708). A measurement signal is received from the in response to the test signal and multiplexed through the ceramic diplexer and to the receiver via the measurement channel (Step 710). A reference signal is derived from the test signal and provided to the receiver via a reference channel (Step 712). A signal indicative of a magnitude of the PIM and a distance to a source of the PIM is obtained by the receiver from the measurement signal and the reference signal (Step 714). The test signal can be transmitted by radiating the test signal via an antenna or by propagating the test signal via a cable. In other embodiments, tones having amplitude above +30 dBm can be used; however, the output power should not exceed the operating limited of the ceramic diplexer.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A compact, low power system for measuring passive intermodulation (PIM), comprising:
   a port;
   a test signal source providing a test signal including two tones each capable of producing a signal at the test port of amplitude +30 decibels referenced to one milliwatt (dBm) or less;
   a dielectric frequency domain multiplexer connected with the port and the test signal source;
   wherein the test signal source is moreover prevented from producing a signal having an output power above the operating limit of the dielectric frequency domain multiplexer;
   wherein the dielectric frequency domain multiplexer is adapted to multiplex the test signal provided by the test signal source and a measurement signal obtained at the port;
   a receiver to receive the multiplexed measurement signal from the dielectric frequency domain multiplexer;
   wherein the receiver has an output that provides a signal indicative of PIM.

2. The lower power system of claim 1 wherein the PIM is measured in a device under test (DUT), the port is connectable to the DUT, and the measurement signal is obtained from the DUT at the port.

3. The low power system of claim 1, further comprising:
   an antenna connectable with the port to transmit the test signal and receive the measurement signal to thereby provide an over-the-air PIM measurement of an environment.

4. The low power system of claim 1, further comprising:
   a reference channel including a PIM reference generator connected with the receiver and providing to the receiver a reference signal having a reference frequency; and
   wherein the reference signal is derivable from the test signal.

5. The low power system of claim 1, further comprising:
   a return loss channel connectable with the receiver to measure return loss.

6. The low power system of claim 1, further comprising:
   a transmit signal filter for filtering the test signal before the test signal is multiplexed by the dielectric frequency domain multiplexer;
   wherein the transmit signal filter is a dielectric filter;
   a first receive signal filter for filtering the measurement signal after the measurement signal is multiplexed by the dielectric frequency domain multiplexer; and
   a second receive signal filter for filtering the measurement signal after the measurement signal is filtered by the first receive signal filter and amplified;
   wherein the first receive signal filter and the second receive signal filter are dielectric filters.

7. The low power system of claim 1, wherein the dielectric frequency domain multiplexer is either a ceramic diplexer or a ceramic triplexer.

8. The low power system of claim 2, further comprising:
   a vector network analyzer, wherein the test signal and the measurement signal are couplable to the vector network analyzer to measure scattering parameters of the DUT.

9. The low power system of claim 4, further comprising:
   a reference signal filter for filtering the reference signal;
   wherein the reference signal filter is a dielectric filter
   wherein the receiver is a synchronous receiver connected with a measurement channel and the reference channel;
   wherein a phase-detector of the synchronous receiver is a synchronous detector.

10. A compact, low power system for measuring passive intermodulation (PIM), comprising:
    a control unit including a test signal source providing a test signal including two tones each capable of producing a signal at the test port of amplitude +30 decibels referenced to one milliwatt (dBm) or less, a receiver to receive a measurement signal obtained in response to a test signal, and wherein the receiver has an output that provides a signal indicative of PIM; and a plurality of frequency sub-assemblies each selectively connectable to the control unit and adapted to generate a test signal in a different frequency band, wherein each of the frequency sub-assemblies comprises a port, a dielectric frequency domain multiplexer connected with the port and the test signal source, wherein the test signal source is moreover prevented from producing a signal with output power above the operating limit of the dielectric frequency domain multiplexer, wherein the dielectric frequency domain multiplexer is adapted to multiplex the test signal provided by the test signal source and the measurement signal obtained at the port.

11. The lower power system of claim 10, wherein the PIM is measured in a device under test (DUT), the port is connectable to the DUT, and the measurement signal is obtained from the DUT at the port.

12. The low power system of claim 10, further comprising:
an antenna connectable with the port to transmit the test signal and receive the measurement signal to thereby provide an over-the-air measurement of an environment.

13. The low power system of claim 10, wherein each of the sub-assemblies is one of a plugin physically separable from the control unit and a component physically housed with the control unit and selectively connectable via switching.

14. The low power system of claim 10, wherein each of the sub-assemblies further comprises
a reference channel including a PIM reference generator connected with the receiver and providing to the receiver a reference signal having a reference frequency, and
wherein the reference signal is derivable from the test signal.

15. The low power system of claim 10, wherein each of the sub-assemblies further comprises
a return loss channel connectable with the receiver to measure return loss.

16. The low power system of claim 10, wherein each of the frequency sub-assemblies further comprises
a transmit signal filter for filtering the test signal before the test signal is multiplexed by the dielectric frequency domain multiplexer;
wherein the transmit signal filter is a dielectric filter;
a first receive signal filter for filtering the measurement signal after the measurement signal is multiplexed by the dielectric frequency domain multiplexer; and
a second receive signal filter for filtering the measurement signal after the measurement signal is filtered by the first receive signal filter and amplified;
wherein the first receive signal filter and the second receive signal filter are dielectric filters.

17. The low power system of claim 14, wherein each reference channel includes a reference signal filter for filtering the reference signal;
wherein the reference signal filter is a dielectric filter;
wherein the receiver is a synchronous receiver connected with a measurement channel and the reference channel; and wherein a phase-detector of the synchronous receiver is a synchronous detector.

18. A plugin for use with a compact, low power system having a test signal source providing a test signal including two tones each capable of producing a signal at the test port of amplitude +30 decibels referenced to one milliwatt (dBm) or less and a receiver to receive a measurement signal and output a signal indicative of passive intermodulation (PIM), the plugin comprising:
a port;
a dielectric frequency domain multiplexer connected with the port and the test signal source; and
wherein the dielectric frequency domain multiplexer is adapted to multiplex the test signal provided by the test signal source and the measurement signal obtained at the port; and
wherein the plugin is useable with the low power system when the test signal source is prevented from producing a signal above the operating limit of the dielectric frequency domain multiplexer.

19. The plugin of claim 18, further comprising
a return loss channel connectable with the receiver to measure return loss.

20. The plugin of claim 18, operable with the low power system having a reference channel connected with the receiver to provide the receiver a reference signal having a reference frequency and a PIM reference generator, wherein:
the plugin provides the measurement signal to the low power system through a measurement channel of the low power system; and
wherein the reference signal is derivable from the test signal.

21. The plugin of claim 18, further comprising:
a transmit signal filter for filtering the test signal before the test signal is multiplexed by the dielectric frequency domain multiplexer;
wherein the transmit signal filter is a dielectric filter;
a first receive signal filter for filtering the measurement signal after the measurement signal is multiplexed by the dielectric frequency domain multiplexer; and
a second receive signal filter for filtering the measurement signal after the measurement signal is filtered by the first receive signal filter and amplified;
wherein the first receive signal filter and the second receive signal filter are dielectric filters.

22. A method for measuring passive intermodulation (PIM), comprising:
using a low power system including a port, a test signal source, a dielectric frequency domain multiplexer connected with the port and the test signal source to multiplex a measurement signal obtained at the port and the test signal provided by the test signal source, a receiver to receive the multiplexed signal from the dielectric frequency domain multiplexer, wherein the test signal source is prevented from producing a signal having an output power above the operating limit of the dielectric frequency domain multiplexer;
generating a test signal including two tones each having an amplitude of +30 decibels referenced to one milliwatt (dBm) or less;
multiplexing the test signal through a dielectric frequency domain multiplexer;
transmitting the test signal;
receiving a measurement signal in response to the test signal;

multiplexing the measurement signal through the dielectric frequency domain multiplexer and to a receiver via a measurement channel;

obtaining from the measurement signal, via the receiver, a signal indicative of PIM.

23. The method of claim 22, wherein the receiver includes a reference channel and further comprising:

deriving a reference signal from the test signal;

providing the reference signal to the receiver via the reference channel;

obtaining from the measurement signal and the reference signal, via the receiver, a signal indicative of a magnitude of the PIM and a distance to a source of the PIM.

24. The method of claim 22, wherein transmitting the test signal comprises one of radiating the test signal to an environment via an antenna and propagating the test signal to a device under test (DUT) via a cable.

* * * * *